(12) United States Patent
Adiki et al.

(10) Patent No.: US 9,195,470 B2
(45) Date of Patent: Nov. 24, 2015

(54) DYNAMIC DATA DIMENSIONING BY PARTIAL RECONFIGURATION OF SINGLE OR MULTIPLE FIELD-PROGRAMMABLE GATE ARRAYS USING BOOTSTRAPS

(71) Applicant: International Business Machines Corporation, Armonk, NY (US)

(72) Inventors: Sreenivas Adiki, Hyderabad (IN); Ravi Kumar Reddy Kanamatareddy, Hyderabad (IN); Siba P. Satapathy, Bangalore (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 331 days.

(21) Appl. No.: 13/947,250

(22) Filed: Jul. 22, 2013

(65) Prior Publication Data

US 2015/0026450 A1   Jan. 22, 2015

(51) Int. Cl.
*G06F 9/00* (2006.01)
*G06F 9/44* (2006.01)
*G06F 9/445* (2006.01)
*G06F 17/50* (2006.01)

(52) U.S. Cl.
CPC .............. *G06F 9/4401* (2013.01); *G06F 8/665* (2013.01); *G06F 9/4406* (2013.01); *G06F 17/5054* (2013.01)

(58) Field of Classification Search
CPC ....... G06F 9/00; G06F 9/4401; G06F 9/4406; G06F 17/5054; G06F 8/665
USPC ...................................... 713/2, 100; 717/168
See application file for complete search history.

(56) References Cited

U.S. PATENT DOCUMENTS

| 4,870,302 | A  | * | 9/1989  | Freeman       | 326/41  |
|-----------|----|---|---------|---------------|---------|
| 6,326,806 | B1 | * | 12/2001 | Fallside et al. | 326/38  |
| 7,017,038 | B1 | * | 3/2006  | LaChance et al. | 713/2   |
| 7,031,267 | B2 | * | 4/2006  | Krumel        | 370/255 |
| 7,932,743 | B1 | * | 4/2011  | Stewart et al. | 326/38  |

(Continued)

FOREIGN PATENT DOCUMENTS

| WO | 2010004369 | 1/2010 |
| WO | 2010014082 | 2/2010 |

OTHER PUBLICATIONS

Morelli et al.; IBM SPSS predictive analytics: Optimizing decisions at the point of impact; Redguides for Business Leaders; Copyright IBM Corp. 2010; 59 pages.

(Continued)

*Primary Examiner* — Chun Cao
(74) *Attorney, Agent, or Firm* — Schmesier, Olsen & Watts

(57) ABSTRACT

An approach is presented for managing resources of a field-programmable gate array (FPGA). At runtime, first data is extracted and processed. At runtime and via a very high speed integrated circuit hardware description language (VHDL) interface, a change in a size, a structure, or a load schedule of next data is received. The change is determined by a quantitative method analyzing the first data and executing external to the FPGA. At runtime, a first bootstrap code in the FPGA executes, and in response, other bootstrap codes in the FPGA are updated. The first bootstrap code is configured to update the structure of the next data. The other bootstrap codes are configured to extract and process, and to determine an order of processing and a configuration of the next data. The next data is extracted and processed based on the updated other bootstrap codes.

20 Claims, 4 Drawing Sheets

(56) References Cited

U.S. PATENT DOCUMENTS

| | | | |
|---|---|---|---|
| 8,103,992 B1 * | 1/2012 | Chan et al. | 716/100 |
| 8,108,235 B2 | 1/2012 | Chowdhary et al. | |
| 8,271,430 B2 | 9/2012 | Willson | |
| 8,554,972 B2 * | 10/2013 | Koch et al. | 710/305 |
| 2007/0208926 A1 * | 9/2007 | Grieve et al. | 713/1 |
| 2009/0254588 A1 | 10/2009 | Li | |
| 2011/0119300 A1 | 5/2011 | Marcade | |
| 2011/0246415 A1 | 10/2011 | Li et al. | |
| 2011/0313979 A1 | 12/2011 | Roberts | |
| 2012/0102053 A1 | 4/2012 | Barrett et al. | |

OTHER PUBLICATIONS

Perera, Darshika Gimhani; Chip-Level and Reconfigurable Hardware for Data Mining Application; A Dissertation Submitted in Partial Fulfillment of the Requirements for the Degree of Doctor of Philosophy in the Department of Electrical and Computer Engineering, University of Victori; Copyright Darshika Gimhani Perera, 2012; 233 pages.

Bartolini et al.; HERA; Hardware Evolution over Reconfigurable Architectures; ASPLOS '11, Newport Beach, CA; Mar. 5-11, 2011; 8 pages.

Anonymous; Statistical Information Architecture on IFW and Structure; IPCOM000225754D; Mar. 4, 2013; 8 pages.

* cited by examiner

DYNAMIC DATA DIMENSIONING BY PARTIAL RECONFIGURATION OF SINGLE OR MULTIPLE FIELD-PROGRAMMABLE GATE ARRAYS USING BOOTSTRAPS

TECHNICAL FIELD

The present invention relates to a data processing method and system for managing a logic device, and more particularly to a technique for managing field-programmable gate array resources.

BACKGROUND

Enterprises are increasing their use of field-programmable gate array (FPGA) based computing systems (i.e., computer appliances) to meet requirements of real-time processing of large and bulk data volumes. An FPGA is defined as a logic device (i.e., logic chip) that includes static random access memory (SRAM) and an array of regularly tiled and interconnected logic elements, which are programmable in the field through different configurations. The configurations may be reprogrammed multiple times, thereby allowing massive instruction-level parallelism. The logic elements in an FPGA may include gates, lookup table random access memory (RAM), and flip-flops. An FPGA may also include programmable interconnects and programmable switches between the logic elements. FPGA based appliances (e.g., the Netezza® database appliance offered by International Business Machines Corporation located in Armonk, N.Y.) are used to develop massive data processing applications involving data warehouses and data mining. FPGA based appliances are used for designing scalable, high-performance, massively parallel analytic platforms designed to manage data volumes on a petabyte scale. Data that is relevant today for a business purpose and direction becomes obsolete over time due to rapid changes in the business environment and the way business is conducted, thereby rendering irrelevant data on the analytical models based on datasets using predefined or static rules. Furthermore, analytics logic using diverse datasets is severely constrained by manual, error-prone identification of relationships across datasets and data elements. The most common single input for building an analytics model is human knowledge, which may not generate the needed results in analytics because of the requirement of data sizes and the fitment to business situation requirements which are not rationalized.

BRIEF SUMMARY

In a first embodiment, the present invention provides a method of managing resources of an FPGA. The method includes a computer at a runtime extracting and processing a first set of data. The method further includes the computer at the runtime and via a very high speed integrated circuit hardware description language (VHDL) interface receiving a change in a size of a next set of data to be processed, a structure of the next set of data to be processed, or a load schedule of the next set of data to be processed. The change is determined by one or more quantitative methods analyzing the first set of data. The quantitative method(s) execute externally to the FPGA. The method further includes based on the received change, the computer at the runtime executing a first bootstrap code in the FPGA. The method further includes in response to the step of executing the first bootstrap code and based on the received change, the computer at the runtime updating at least one bootstrap code included in a plurality of other bootstrap codes in the FPGA. The first bootstrap code is configured to dimension the next set of data. The plurality of other bootstrap codes include a second bootstrap code configured to extract the next set of data from a data source, a third bootstrap code configured to process the next set of data extracted by the second bootstrap code, a fourth bootstrap code configured to determine an order in which the next set of data is processed by the third bootstrap code, and a fifth bootstrap code configured to determine a configuration of the next set of data. The update of the at least one bootstrap code is based on the received change in the size, structure or load schedule of the next set of data. The method further includes based on the received change and the updated at least one bootstrap code, the computer extracting and subsequently processing the next set of data from the data source.

In a second embodiment, the present invention provides a central processing unit (CPU); a memory coupled to the CPU; and a computer-readable, tangible storage device coupled to the CPU. The storage device includes instructions that are executed by the CPU via the memory to implement a method of managing resources of an FPGA. The method includes a computer system at a runtime extracting and processing a first set of data. The method further includes the computer system at the runtime and via a very high speed integrated circuit hardware description language (VHDL) interface receiving a change in a size of a next set of data to be processed, a structure of the next set of data to be processed, or a load schedule of the next set of data to be processed. The change is determined by one or more quantitative methods analyzing the first set of data. The quantitative method(s) execute externally to the FPGA. The method further includes based on the received change, the computer system at the runtime executing a first bootstrap code in the FPGA. The method further includes in response to the step of executing the first bootstrap code and based on the received change, the computer system at the runtime updating at least one bootstrap code included in a plurality of other bootstrap codes in the FPGA. The first bootstrap code is configured to dimension the next set of data. The plurality of other bootstrap codes include a second bootstrap code configured to extract the next set of data from a data source, a third bootstrap code configured to process the next set of data extracted by the second bootstrap code, a fourth bootstrap code configured to determine an order in which the next set of data is processed by the third bootstrap code, and a fifth bootstrap code configured to determine a configuration of the next set of data. The update of the at least one bootstrap code is based on the received change in the size, structure or load schedule of the next set of data. The method further includes based on the received change and the updated at least one bootstrap code, the computer system extracting and subsequently processing the next set of data from the data source.

In a third embodiment, the present invention provides a computer program product including a computer-readable, tangible storage device and a computer-readable program code stored in the computer-readable, tangible storage device. The computer-readable program code includes instructions that are executed by a central processing unit (CPU) of a computer system to implement a method of managing resources of an FPGA. The method includes a computer system at a runtime extracting and processing a first set of data. The method further includes the computer system at the runtime and via a very high speed integrated circuit hardware description language (VHDL) interface receiving a change in a size of a next set of data to be processed, a structure of the next set of data to be processed, or a load schedule of the next set of data to be processed. The change is determined by one or more quantitative methods analyzing the first set of data. The quantitative method(s) execute externally to the FPGA. The method further includes based on the received change, the computer system at the runtime executing a first bootstrap code in the FPGA. The method further includes in response to the step of executing the first bootstrap code and based on the received change, the computer system at the runtime updating at least one bootstrap code included in a plurality of other bootstrap codes in the FPGA. The first bootstrap code is configured to dimension the next set of data. The plurality of other bootstrap codes include a second bootstrap code configured to extract the next set of data from a data source, a third bootstrap code configured to process the next set of data extracted by the second bootstrap code, a fourth bootstrap code configured to determine an order in which the next set of data is processed by the third bootstrap code, and a fifth bootstrap code configured to determine a configuration of the next set of data. The update of the at least one bootstrap code is based on the received change in the size, structure or load schedule of the next set of data. The method further includes based on the received change and the updated at least one bootstrap code, the computer system extracting and subsequently processing the next set of data from the data source.

Embodiments of the present invention update bootstraps in a single FPGA or in paired, multiple, or multiple paired FPGAs to perform dynamic data dimensioning by partial reconfiguration of the FPGA(s), where the updating of the bootstraps is provided by feedback from quantitative method(s). In one embodiment, the updated bootstraps are based on changes to a data profile which are related to changes in a business situation. Bootstraps in one or more FPGAs are also referred to herein as bootstrap codes.

DETAILED DESCRIPTION

Overview

Embodiments of the present invention provide dynamic reconfigurations of resources of an FPGA by means of self-updating bootstrap codes in the FPGA. The dynamic reconfigurations of resources provide dynamic functional resource distribution that achieves dynamic data dimensioning of data organization, which results in changes in Extract, Transform and Load (ETL), model use, process dynamics, storage dimensions, etc. associated with the FPGA. Bootstrapping in the FPGA is a technique in which a new and restructured bootstrap code is uploaded to an idle FPGA, which results in a partial reconfiguration of the FPGA, and which allows a job to be performed as requested and releases resources of the FPGA for reusability by allowing space to another bootstrap request during recursion workflow. In one embodiment, a single bootstrap code that provides data dimensioning for an appliance controls the updating of multiple other loadable bootstrap codes. The bootstrap codes for respective jobs are refined on every recursion and redistributed for needed steps in data processing and data organization, thereby allowing control of an FPGA built appliance for managing substantially large volumes of data processing and analytics. Although dynamic data dimensioning by partial reconfiguration is described herein relative to a single FPGA, those skilled in the art will realize that the single FPGA may be replaced with paired FPGAs (i.e., a first FPGA paired with a second, mirror or replica FPGA which includes a replica of the bootstrap code in the first FPGA), multiple FPGAs including respective bootstrap codes, or multiple paired FPGAs (i.e., multiple FPGAs and their respective replica FPGAs). Multiple FPGAs are configured to process multiple concurrent transactions in parallel, which may be required by bulk activities of data management in a "big data" scenario.

System for Managing Resources of an FPGA

Figure 1:
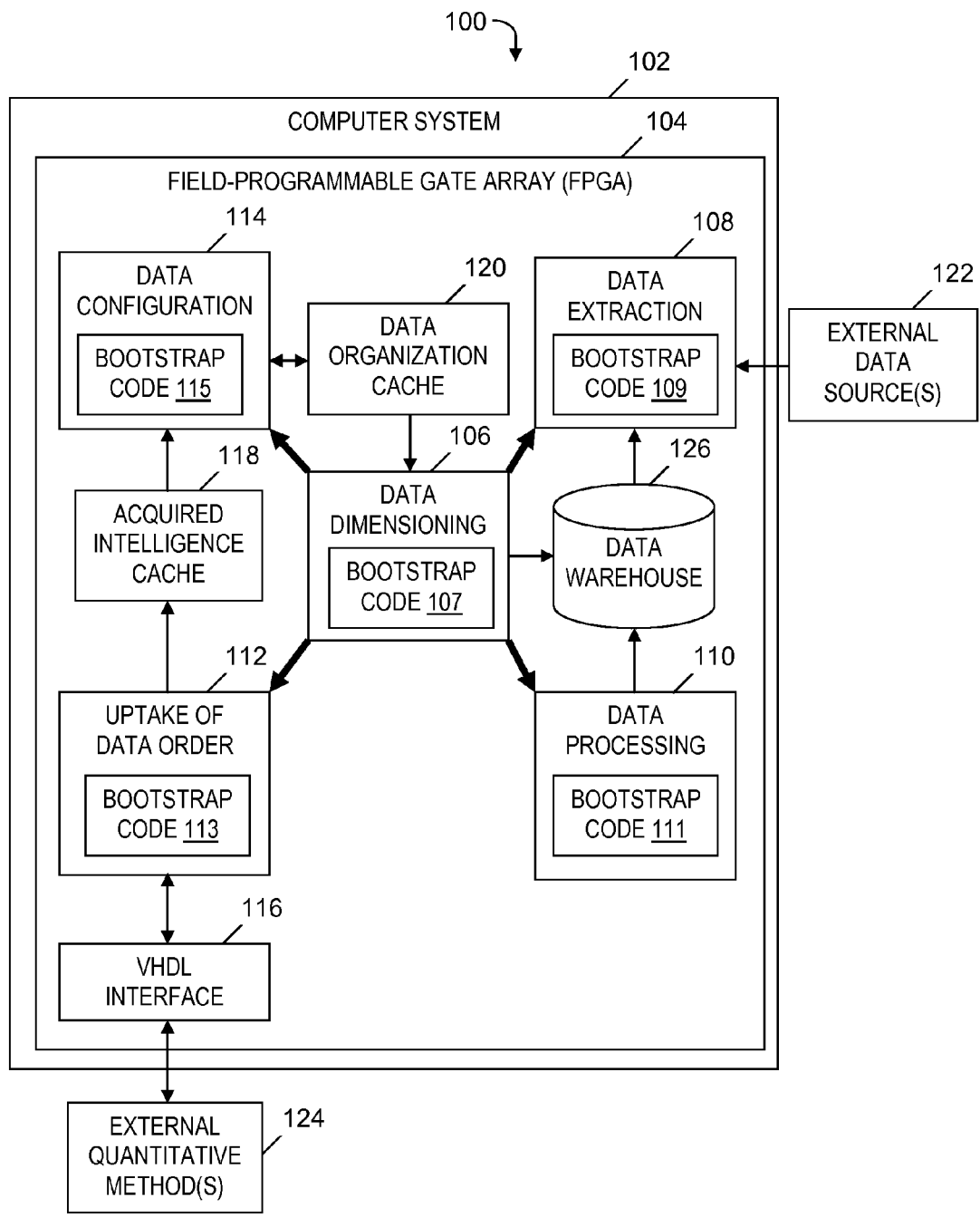
FIG. 1 is a block diagram of a system for managing resources of an FPGA, in accordance with embodiments of the present invention.

FIG. 1 is a block diagram of a system for managing resources of an FPGA, in accordance with embodiments of the present invention. A system 100 includes a computer system 102, which includes an FPGA 104. In one embodiment, computer system 102 is a computer appliance. FPGA 104 is a logic device that includes the following resources: static random access memory (SRAM) or other storage elements and an array of interconnected configurable logic blocks (i.e., logic cells). The logic blocks are programmable by different configurations, thereby making FPGA 104 part of a customizable integrated circuit. In one embodiment, the configurable logic blocks are look-up tables. The configurations that program the logic blocks may be reprogrammed a substantial number of times to allow massive instruction-level parallelism.

The configurable logic blocks in FPGA 104 include the following functional elements: data dimensioning 106, data extraction 108, data processing 110, uptake of data order 112 and data configuration 114, which include bootstrap codes 107, 109, 111, 113 and 115, respectively. In one embodiment, the configurable logic blocks in FPGA 104 are logic gates used to implement the logic of a respective one or more functional elements and storage elements needed to store data being passed from one functional element to the next functional element.

Bootstrap codes 107, 109, 111, 113 and 115 include new and restructured code for the respective aforementioned functional elements, where the new and restructured code is uploaded to FPGA 104, which results in a partial reconfiguration of FPGA 104. As used herein, a partial reconfiguration of FPGA 104 is defined as a reconfiguration of one or more of bootstrap codes 107, 109, 111, 113 and 115, where the reconfiguration of the bootstrap codes affects sizes of data, structure of data and/or load schedules of data. Bootstrap codes 107, 109, 111, 113 and 115 provide loadable bootstraps for FPGA 104.

FPGA 104 also includes a very high speed integrated circuit hardware description language (VHDL) interface 116, an acquired intelligence cache 118 and a data organization cache 120.

Data extraction 108 extracts data from a data stream provided by one or more external data sources 122.

Uptake of data order 112 generates called instances of a required foreign model that uses one or more external quantitative methods 124 to execute an optimization model via VHDL interface 116. External quantitative method(s) 124 are routines executed external to FPGA 104, which analyze the data extracted from external data source(s) 122 by statistical inference. In one embodiment, the statistical inference is based on time series analysis and stochastic processes. The execution of external quantitative method(s) 124 results in dynamically determined changes to one or more of bootstrap codes 107, 109, 111, 113 and 115. In one embodiment, VHDL interface 116 is specified by the Institute of Electrical and Electronics Engineers (IEEE) 1076-2008 standard. In another embodiment, VHDL interface 116 is specified by an IEEE standard other than 1076-2008, and may include an IEEE standard for VHDL defined before or after 1076-2008 was defined. Uptake of data order 112 determines recommendations for ordering data in the extracted data from a previous cycle of extracting cognition indices, and stores the recommendations in cache 118 as dynamically acquired intelligence about the usage of the data extracted from external data source(s) 122.

Data configuration 114 applies the aforementioned recommendations to data being processed by data processing 110. Data configuration 114 determines an organization (i.e., data organization) of the data extracted from external data source(s) 122 based on the aforementioned recommendations, and stores the data organization in data organization cache 120.

Data dimensioning 106 dimensions data from external data source(s) 122 and updates data organization based on the recommendations stored in acquired intelligence cache 118, thereby enhancing and rationalizing data processing across computer system 102.

Data processing 110 accesses data models and schemas stored in a data warehouse 126 (i.e., database) to process the data extracted from external data source(s) 122 in a current cycle for a current transaction. Data extraction 108 and data dimensioning 106 accesses current mapping and filtering configurations to check if the configurations have been changed as compared to configurations used to process data in a previous cycle for a previous transaction.

Data dimensioning 106 updates bootstrap codes 107, 109, 111, 113, and 115, or a combination of the aforementioned bootstrap codes, in order to dynamically manage resources of FPGA 104 and generate a partial reconfiguration of FPGA 104. Data dimensioning 106 provides control of other bootstrap codes via simple parallelism because data dimensioning 106 is a single bootstrap code controlling the status of other bootstrap codes dynamically. The updating of the bootstrap codes and the dynamic management of the resources of FPGA 104 are discussed in more detail below relative to FIG. 2A and FIG. 2B. In one embodiment, data dimensioning 106 manages the update of resource allocation rules for FPGA 104. In one embodiment, data dimensioning 106 manages data mining objectives of a computer appliance that includes FPGA 104.

In an alternate embodiment, instead of bootstrap codes 107, 109, 111, 113 and 115 being included in the same FPGA 104 as shown in FIG. 1, the aforementioned bootstrap codes are included in multiple FPGAs (not shown), in a one-to-one correspondence.

The functionality of the components of FIG. 1 is described in more detail in the discussion presented below relative to FIG. 2A, FIG. 2B and FIG. 3.

Process for Managing Resources of an FPGA

Figure 2A:
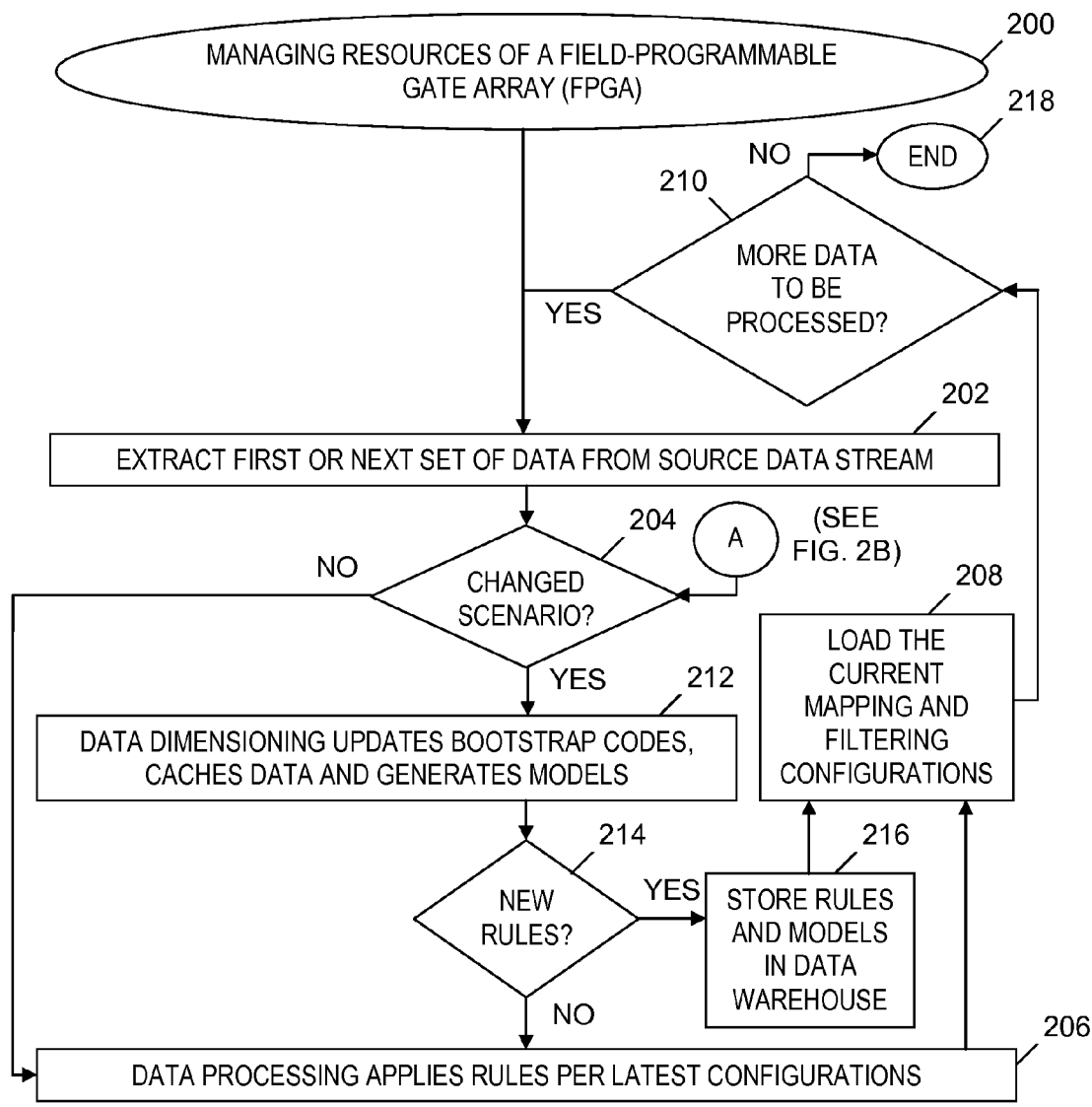
FIG. 2A is a flowchart of a process of managing resources of an FPGA, in accordance with embodiments of the present invention.

FIG. 2A is a flowchart of a process of managing resources of an FPGA, in accordance with embodiments of the present invention. The process of FIG. 2A starts at step 200. In step 202, data extraction 108 (see FIG. 1) extracts a first set of data or a next set of data from external data source(s) 122 (see FIG. 1). In one embodiment, external data source(s) 122 (see FIG. 1) includes a source data stream.

In step 204, data dimensioning 106 (see FIG. 1) determines a configuration of data extracted in step 202 and based on the determined configuration, determines whether there is a changed scenario. In step 204, data dimensioning 106 determines there is a changed scenario if a configuration of the first set of data extracted in step 202 does not match any configuration stored in data warehouse 126 (see FIG. 1), and determines that there is no changed scenario if the configuration of the first set of data extracted in step 202 matches a configuration stored in data warehouse 126 (see FIG. 1). The aforementioned configurations are stored in data warehouse 126 (see FIG. 1) by a performance of step 208 in a previous iteration of the process of FIG. 2A, where step 208 is described below. For the first set of data being processed, step 204 determines that there is no changed scenario, and then the No branch of step 204 is taken and step 206 is performed.

In step 206, data processing 110 (see FIG. 1) processes the first set of data extracted in step 202 by applying predetermined rules stored in data warehouse 126 (see FIG. 1) to assign resources of FPGA 104 (see FIG. 1) as needed by a current transaction in a current cycle.

In step 208, data dimensioning 106 (see FIG. 1) loads the current mapping and filtering configurations from data warehouse 126 (see FIG. 1). In a case in which a previous performance of step 208 had loaded mapping and filtering configurations to allocate memory space or other resources in FPGA 104 (see FIG. 1) for processing of data to conform with a first business scenario, the current performance of step 208 re-allocates the memory space or other resources of FPGA 104 (see FIG. 1) for upcoming processing of data to conform with a second, updated business scenario.

In step 210, data extraction 108 (see FIG. 1) determines whether there is more data to be extracted and processed. If data extraction 108 (see FIG. 1) determines in step 210 that there is more data to be extracted and processed, then the Yes branch of step 210 is taken and step 202 is performed for a next set of data.

In step 202 following the Yes branch of step 210, data extraction 108 (see FIG. 1) extracts a next set of data from external data source(s) 122 (see FIG. 1).

If data dimensioning 106 (see FIG. 1) determines in step 204 that there is no changed scenario, then the No branch of step 204 is taken and the process continues with step 206, as described above. If data dimensioning 106 (see FIG. 1) determines in step 204 that there is a changed scenario, then the Yes branch of step 204 is taken and step 212 is performed.

In step 212, data dimensioning 106 (see FIG. 1) caches data in data warehouse 126 (see FIG. 1), where the cached data is included in the next set of data that was extracted in the most recent performance of step 202. In step 212, data dimensioning 106 (see FIG. 1) also generates model(s) based on the next set of data extracted in the most recent performance of step 202, stores the model(s) in data warehouse 126 (see FIG. 1). Also in step 212, data dimensioning 106 (see FIG. 1) updates bootstrap codes 107, 109, 111, 113 and 115 based on the configuration of the next set of data extracted in the most recent performance of step 202.

In step 214, data dimensioning 106 (see FIG. 1) determines whether new rules need to be generated for the configuration of the aforementioned next set of data. If new rules need to be generated, then data dimensioning 106 (see FIG. 1) generates the new rules, the Yes branch of step 214 is taken, and step 216 is performed. If new rules do not need to be generated, then the No branch of step 214 is taken, and the process of FIG. 2A continues with step 206, as described above.

In step 216, data dimensioning 106 (see FIG. 1) stores in data warehouse 126 (see FIG. 1) any rules generated as a result of step 214 and model(s) generated in step 212. Following step 216, data dimensioning 106 (see FIG. 1) in step 208 loads the current mapping and filtering configurations for the next set of data extracted in the most recent performance of step 202. If data extraction 108 (see FIG. 1) determines in step 210 that more data needs to be extracted and processed, then the Yes branch of step 210 is taken, and the process of FIG. 2A continues with another iteration starting at step 202. If data extraction 108 (see FIG. 1) determines in step 210 that no more data needs to be extracted and processed, then the No branch of step 210 is taken and the process of FIG. 2A ends at step 218.

In one embodiment, step 206 includes a fresh invocation of resources of FPGA 104 (see FIG. 1) based on code for allocation of the aforementioned resources being updated by the bootstrap codes updated in step 212 and the loading of the current mapping filtering configurations in step 208 in a previous iteration of the process of FIG. 2A. The resources being freshly invoked in step 206 may be structurally different from the resources invoked in a prior iteration of the process of FIG. 2A. For example, in an enterprise data demand situation, the bootstrap codes updated in step 212 upload code for processing of a large volume of data in reusable resources of FPGA 104 (see FIG. 1).

In one embodiment, the updating of the bootstrap codes in step 212 provides a self-reconfiguration of the bootstrap codes, which provides for optimized partial reconfigurations of FPGA 104 (see FIG. 1) by improved execution of the bootstrap codes in subsequent iterations of the process of FIG. 2A.

In one embodiment, the dynamic updates of bootstrap codes in the process of FIG. 2A manages three critical stages of data organization (i.e., the stages of analyze, rationalize and automate) in an implementation of ETL. These three stages are sequential and are merged seamlessly into partial reconfiguration of FPGA 104 (see FIG. 1). The actions performed in the three stages are managed by the bootstrap codes updated in the process of FIG. 2A.

The bootstrapping code updated in step 212 provides intelligence to know the simplest available configuration for all actions that are updated through multiple iterations of the process of FIG. 2A. The actions include the processing of the data in step 206 and redistributing resources of FPGA 104 (see FIG. 1) for multiple reuses with refined and dynamically updated configurations.

Figure 2B:
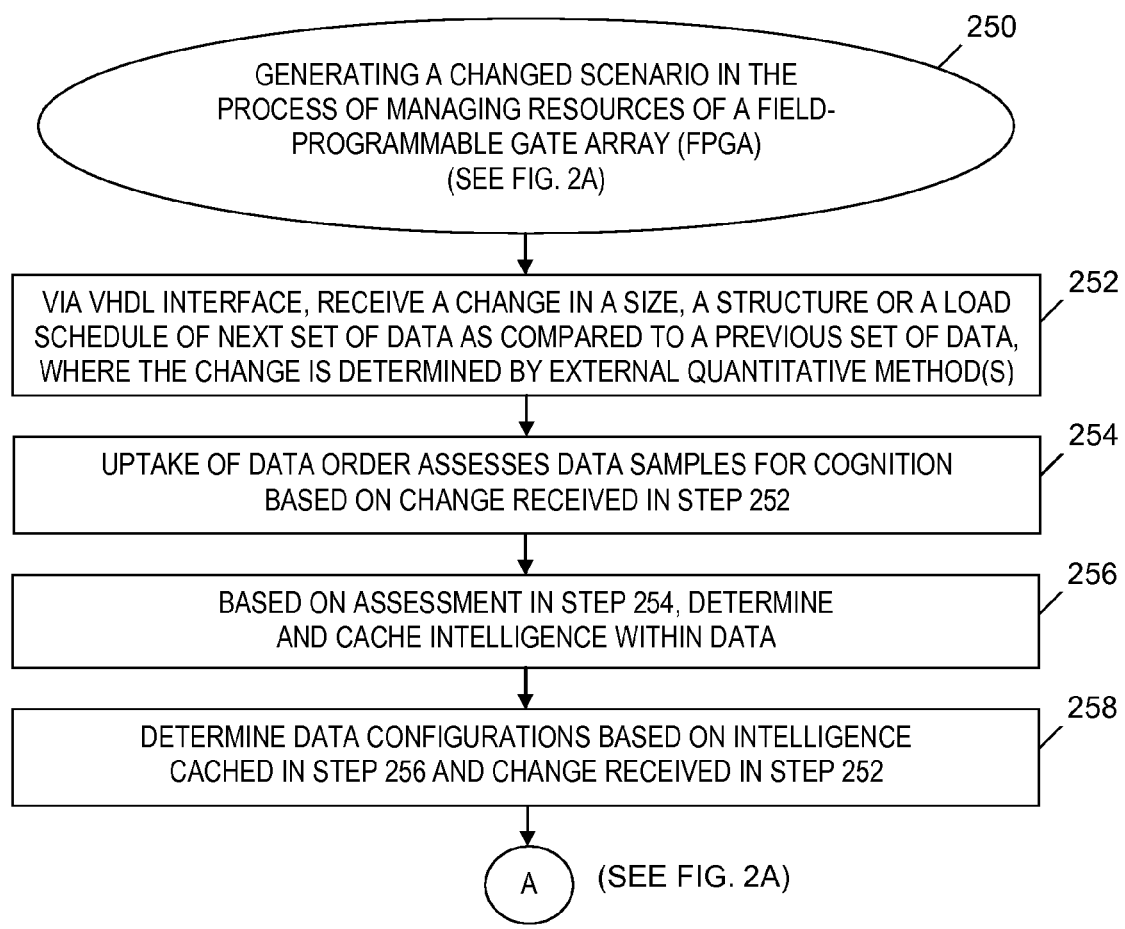
FIG. 2B is a flowchart of a process of generating a changed scenario in the process of FIG. 2A, in accordance with embodiments of the present invention.

In one embodiment, the configurations loaded in step 208 in multiple iterations of the process of FIG. 2B provide dynamically updated data organization by iterations of updating and storing models and data schema in data warehouse 126 (see FIG. 1) in step 212 and step 216. This dynamic data organization is lacking in current big data management systems because of the time required for data processing and corrections. By the capability of FPGA 104 (see FIG. 1) to process petabytes of information, the process of FIG. 2A can provide the dynamic data organization that current systems lack.

In one embodiment, the partial reconfiguration and updating of bootstrap codes in step 212 to dynamically reuse resources of FPGA 104 (see FIG. 1) provides dynamic data reorganization that updates the collection of data in step 202, the processing of data in step 206 and the storing of data in step 216 in data warehouse 126 (see FIG. 1). This dynamic data reorganization accommodates the processing of data in a continually changing business situation.

In one embodiment, a step is added to the process of FIG. 2A (e.g., after step 208) to audit the dynamic changes made in the actions performed by various resources of FPGA 104 (see FIG. 1), as a result of the bootstrap codes updated in step 212. The resources are task specific and may encounter exceptions, and some of these exceptions may go unnoticed by the bootstrap codes 107, 109, 111, 113 and 115 (see FIG. 1).

FIG. 2B is a flowchart of a process of generating a changed scenario in the process of FIG. 2A, in accordance with embodiments of the present invention. The process of FIG. 2B starts at step 250, after step 202 (see FIG. 2A) has been performed at least once. In step 252, via VHDL interface 116 (see FIG. 1), uptake of data order 112 (see FIG. 1) receives a change in (1) a size, (2) a structure, and/or (3) a load schedule (i.e., load parameter(s)) based on external quantitative method(s) 124 (see FIG. 1) applying statistical inference on a set of data extracted in a most recent performance of step 202 (see FIG. 2A).

In one embodiment, step 252 provides proactive data verification for determining the applicability of a data distribution to models and for rejection by exception and recovery of alternative sets of relationships by performing recursion through the use of external quantitative routines 124 (see FIG. 1), which are integrated with FPGA 104 (see FIG. 1) through VHDL interface 116 (see FIG. 1). In one example in which FPGA 104 is in a Netezza® database appliance, since the Netezza® database appliance cannot hold a data investigation algorithm onboard except one operationally supported by an embedded SQL engine based transformations in the operating environment, the design of FPGA 104 allows the VHDL standard to be used to interface to external libraries providing data investigation algorithms. The external libraries may be managed by different and servers remote from computer system 102 (see FIG. 1).

In step 254, based on the change received in step 252, uptake of data order 112 (see FIG. 1) assesses samples of the set of data extracted in the most recent performance of step 202 (see FIG. 2A).

In step 256, based on the assessment in step 254, uptake of data order 112 (see FIG. 1) determines intelligence within the set of data extracted in the most recent performance of step 202 (see FIG. 2A), and subsequently caches the intelligence in acquired intelligence cache 118 (see FIG. 1).

In step 258, based on the intelligence determined in step 256 and the change received in step 252, data configuration 114 (see FIG. 1) determines data configurations for the set of data extracted in the most recent performance of step 202 (see FIG. 2A). Also in step 258, data configuration 114 (see FIG. 1) caches the data configurations in data organization cache 120 (see FIG. 1). There is a changed scenario as determined in step 204 (see FIG. 2A) (i.e., the process of FIG. 2A takes the Yes branch of step 204) based on steps 252, 254, 256 and 258 having been performed. Following step 258, the process continues with step 204 in FIG. 2A.

Example

As one example of the process shown in FIG. 2A, consider analytics associated with usage of a social media website, where age is a parameter. Data records of usage of the social media website are determined according to a filter that extracts data in step 202 (see FIG. 2A) associated with users whose age is greater than 30. Bootstraps 107, 109, 111, 113 and 115 (see FIG. 1) determine a configuration for FPGA 104 (see FIG. 1) so that the data associated with users whose age is greater than 30 can be processed in step 206 (see FIG. 2A).

A change in a business scenario causes a significant increase in the number of users of the social media website XYZ who are younger than 20 years old. This significant change in the number of XYZ users whose age is less than 20 is determined by external quantitative method(s) 124 (see FIG. 1) in step 252 (see FIG. 2B). By completing step 252 and the other steps in the process of FIG. 2B, the inquiry in step 204 (see FIG. 2A) about whether there is a changed scenario is determined to be Yes and in step 212 (see FIG. 2A), data dimensioning 106 (see FIG. 1) updates bootstrap code 109 (see FIG. 1) in data extraction 108 (see FIG. 1) and generates new rules for extracting data about XYZ users whose age is less than 20. The new rules are detected in step 214 (see FIG. 2A) and the rules are stored in data warehouse 126 (see FIG. 1) in step 216 (see FIG. 2A). In step 208, the updated bootstrap code 109 is loaded so that data extraction 108 (see FIG. 1) is configured to extract data about XYZ users whose age is less than 20. The process of FIG. 2A loops back to step 202, with data extraction 108 (see FIG. 1) extracting data about XYZ users whose age is less than 20, and subsequently data processing 110 (see FIG. 1) processing the most recently extracted data according to the aforementioned new rules and the most recent configuration in step 206 (see FIG. 2A), thereby reallocating the resources of FPGA 104 (see FIG. 1) according to the updated business scenario.

Computer System

Figure 3:
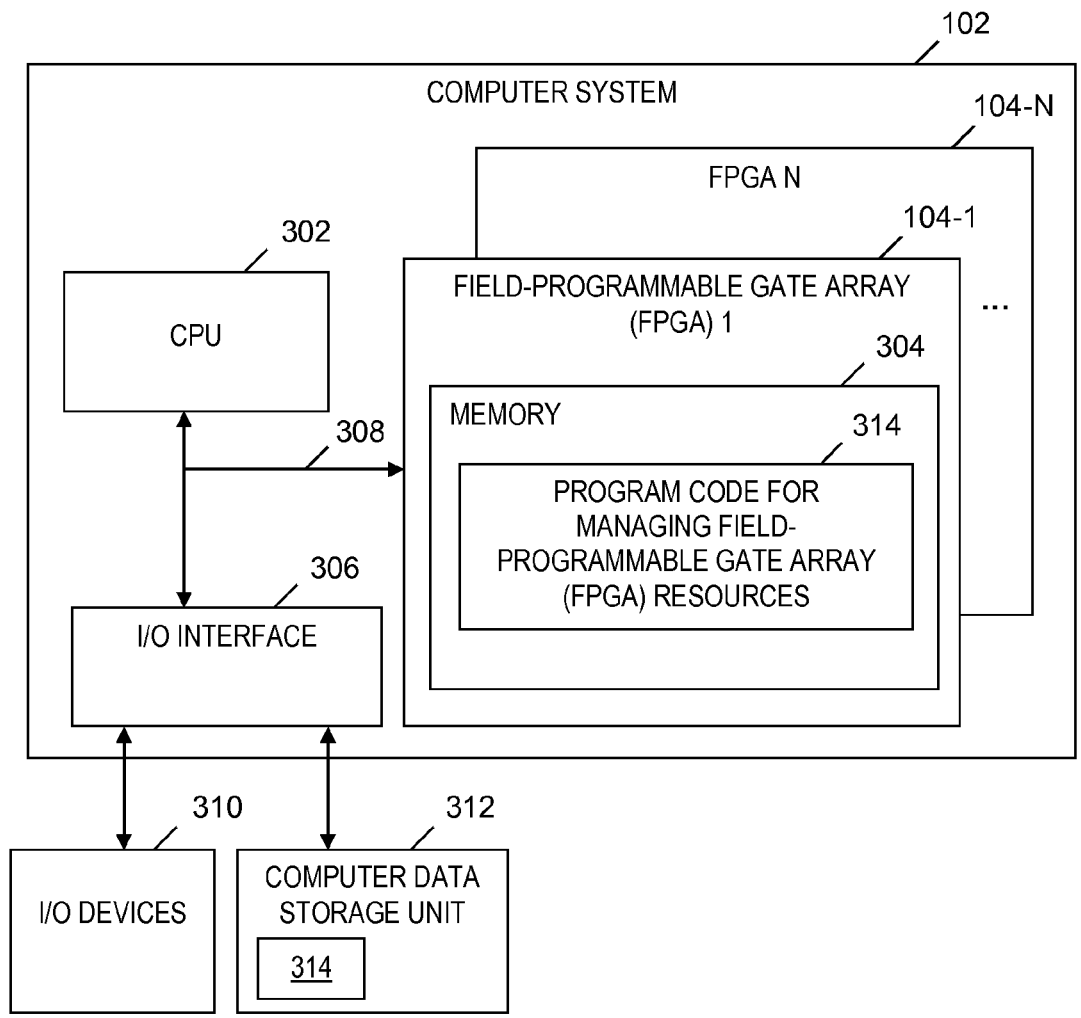
FIG. 3 is a block diagram of a computer system included in the system of FIG. 1 and which implements the processes of FIG. 2A and FIG. 2B, in accordance with embodiments of the present invention.

FIG. 3 is a block diagram of a computer system included in the system of FIG. 1 and which implements the processes of FIG. 2A and FIG. 2B, in accordance with embodiments of the present invention. Computer system 102 generally includes a central processing unit (CPU) 302, a memory 304, an input/output (I/O) interface 306, and a bus 308. Further, computer system 102 is coupled to I/O devices 310 and a computer data storage unit 312. CPU 302 performs computation and control functions of computer system 102, including executing instructions included in program code 314 in FPGA 104-1 to perform a method of managing resources of an FPGA, where the instructions are executed by CPU 302 via memory 304. In one embodiment, FPGA 104-1 is FPGA 104 (see FIG. 1). CPU 302 may include a single processing unit, or be distributed across one or more processing units in one or more locations (e.g., on a client and server). In one embodiment, program code 314 includes bootstrap codes 107, 109, 111, 113 and 115 shown in FIG. 1 and may include other program code of FPGA 104-1 (see FIG. 1). Computer system 102 includes N FPGAs (i.e., FPGA 104-1 . . . FPGA 104-N), where N≥1. If N>1, each of the other FPGA(s) of the N FPGAs includes memory 304 and program code 314, which are described above relative to FPGA 104-1, but which are not shown in FPGA 104-N.

Memory 304 includes a known computer-readable storage medium, which is described below. In one embodiment, cache memory elements of memory 304 provide temporary storage of at least some program code (e.g., program code 314) in order to reduce the number of times code must be retrieved from bulk storage while instructions of the program code are executed. Moreover, similar to CPU 302, memory 304 may reside at a single physical location, including one or more types of data storage, or be distributed across a plurality of physical systems in various forms. Further, memory 304 can include data distributed across, for example, a local area network (LAN) or a wide area network (WAN).

I/O interface 306 includes any system for exchanging information to or from an external source. I/O devices 310 include any known type of external device, including a display device (e.g., monitor), keyboard, mouse, printer, speakers, handheld device, facsimile, etc. Bus 308 provides a communication link between each of the components in computer system 102, and may include any type of transmission link, including electrical, optical, wireless, etc.

I/O interface 306 also allows computer system 102 to store information (e.g., data or program instructions such as program code 314) on and retrieve the information from computer data storage unit 312 or another computer data storage unit (not shown). In one embodiment, program code 314 is stored on computer data storage unit 312. Computer data storage unit 312 includes a known computer-readable storage medium, which is described below. In one embodiment, computer data storage unit 312 is a non-volatile data storage device, such as a magnetic disk drive (i.e., hard disk drive) or an optical disc drive (e.g., a CD-ROM drive which receives a CD-ROM disk).

Memory 304 and/or storage unit 312 may store computer program code 314 that includes instructions that are executed by CPU 302 via memory 304 to manage resources of an FPGA. Although FIG. 3 depicts memory 304 as including program code 314, the present invention contemplates embodiments in which memory 304 does not include all of code 314 simultaneously, but instead at one time includes only a portion of code 314.

Further, memory 304 may include other systems not shown in FIG. 3, such as an operating system (e.g., Linux®) that runs on CPU 302 and provides control of various components within and/or connected to computer system 102. Linux is a registered trademark of Linus Torvalds in the United States, other countries, or both.

Storage unit 312 and/or one or more other computer data storage units (not shown) that are coupled to computer system 102 may store data from external data source(s) 122 (see FIG. 1) and/or data warehouse 126 (see FIG. 1).

As will be appreciated by one skilled in the art, in a first embodiment, the present invention may be a system; in a second embodiment, the present invention may be a method; and in a third embodiment, the present invention may be a computer program product. A component of an embodiment of the present invention may take the form of an entirely hardware-based component, an entirely software component (including firmware, resident software, micro-code, etc.) or a component combining software and hardware sub-components that may all generally be referred to herein as a "module".

An embodiment of the present invention may take the form of a computer program product embodied in one or more computer-readable medium(s) (e.g., memory 304 and/or computer data storage unit 312) having computer-readable program code (e.g., program code 314) embodied or stored thereon.

Any combination of one or more computer-readable mediums (e.g., memory 304 and computer data storage unit 312) may be utilized. In one embodiment, the computer-readable medium is a computer-readable storage medium. In another embodiment, the computer-readable medium is a computer-readable signal medium. As used herein, a computer-readable storage medium is not a computer-readable signal medium.

In one embodiment, the computer-readable storage medium is a physical, tangible computer-readable storage device or physical, tangible computer-readable storage apparatus that stores but does not propagate, and is not a transitory form of signal transmission. A computer-readable storage medium may include, for example, an electronic, magnetic, optical, electromagnetic, or semiconductor system, apparatus, device or any suitable combination of the foregoing. A non-exhaustive list of more specific examples of the computer-readable storage medium includes: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium is a physical, tangible storage medium that can contain or store a program (e.g., program 314) for use by or in connection with a system, apparatus, or device for carrying out instructions in the program, and which does not propagate. The term "computer-readable storage device" does not include signal propagation media such as copper cables, optical fibers and wireless transmission media.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, or any suitable combination thereof. A computer-readable signal medium may be any computer-readable medium that is not a computer-readable storage medium and that can communicate, propagate, or transport a program for use by or in connection with a system, apparatus, or device for carrying out instructions.

Program code (e.g., program code 314) embodied on a computer-readable medium may be transmitted using any appropriate medium, including but not limited to wireless, wireline, optical fiber cable, radio frequency (RF), etc., or any suitable combination of the foregoing.

Computer program code (e.g., program code 314) for carrying out operations for aspects of the present invention may be written in any combination of one or more programming languages, including an object oriented programming language such as Java®, Smalltalk, C++ or the like and conventional procedural programming languages, such as the "C" programming language or similar programming languages. Java and all Java-based trademarks are trademarks or registered trademarks of Oracle and/or its affiliates. Instructions of the program code may be carried out entirely on a user's computer, partly on the user's computer, as a stand-alone software package, partly on the user's computer and partly on a remote computer or entirely on the remote computer or server, where the aforementioned user's computer, remote computer and server may be, for example, computer system 102 or another computer system (not shown) having components analogous to the components of computer system 102 included in FIG. 3. In the latter scenario, the remote computer may be connected to the user's computer through any type of network (not shown), including a LAN or a WAN, or the connection may be made to an external computer (e.g., through the Internet using an Internet Service Provider).

Aspects of the present invention are described herein with reference to flowchart illustrations (e.g., FIG. 2A and FIG. 2B) and/or block diagrams of methods, apparatus (systems) (e.g., FIG. 1 and FIG. 3), and computer program products according to embodiments of the invention. It will be understood that each block of the flowchart illustrations and/or block diagrams, and combinations of blocks in the flowchart illustrations and/or block diagrams, can be implemented by computer program instructions (e.g., program code 314). These computer program instructions may be provided to one or more hardware processors (e.g., CPU 302) of a general purpose computer, special purpose computer, or other programmable data processing apparatus to produce a machine, such that the instructions, which are executed via the processor(s) of the computer or other programmable data processing apparatus, create means for implementing the functions/acts specified in the flowcharts and/or block diagram block or blocks.

These computer program instructions may also be stored in a computer-readable medium (e.g., memory 304 or computer data storage unit 312) that can direct a computer (e.g., computer system 102), other programmable data processing apparatus, or other devices to function in a particular manner, such that the instructions (e.g., program 314) stored in the computer-readable medium produce an article of manufacture including instructions which implement the function/act specified in the flowcharts and/or block diagram block or blocks.

The computer program instructions may also be loaded onto a computer (e.g., computer system 102), other programmable data processing apparatus, or other devices to cause a series of operational steps to be performed on the computer, other programmable apparatus, or other devices to produce a computer-implemented process such that the instructions (e.g., program 314) which are executed on the computer, other programmable apparatus, or other devices provide processes for implementing the functions/acts specified in the flowcharts and/or block diagram block or blocks.

Any of the components of an embodiment of the present invention can be deployed, managed, serviced, etc. by a service provider that offers to deploy or integrate computing infrastructure with respect to managing resources of an FPGA. Thus, an embodiment of the present invention discloses a process for supporting computer infrastructure, where the process includes providing at least one support service for at least one of integrating, hosting, maintaining and deploying computer-readable code (e.g., program code 314) in a computer system (e.g., computer system 102) including one or more processors (e.g., CPU 302), wherein the processor(s) carry out instructions contained in the code causing the computer system to manage resources of an FPGA. Another embodiment discloses a process for providing at least one support service for at least one of creating, integrating, hosting, maintaining, and deploying computer-readable program code 314 in computer system 102, where program code 314 is executed by CPU 302 to implement the steps included in FIG. 2A and FIG. 2B.

The flowcharts in FIGS. 2A-2B and the block diagrams in FIG. 1 and FIG. 3 illustrate the architecture, functionality, and operation of possible implementations of systems, methods, and computer program products according to various embodiments of the present invention. In this regard, each block in the flowcharts or block diagrams may represent a module, segment, or portion of code (e.g., program code 314), which includes one or more executable instructions for implementing the specified logical function(s). It should also be noted that, in some alternative implementations, the functions noted in the block may occur out of the order noted in the figures. For example, two blocks shown in succession may, in fact, be performed substantially concurrently, or the blocks may sometimes be performed in reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method of managing resources of a field-programmable gate array (FPGA), the method comprising the steps of:

a computer at a runtime extracting and processing a first set of data;

via a very high speed integrated circuit hardware description language (VHDL) interface, the computer at the runtime receiving a change in a size of a next set of data to be processed, a structure of the next set of data to be processed, or a load schedule of the next set of data to be processed, the change determined by a quantitative method analyzing the first set of data, the quantitative method executing external to the FPGA;

based on the received change, the computer at the runtime executing a first bootstrap code in the FPGA;

in response to the step of executing the first bootstrap code and based on the received change, the computer at the runtime updating at least one bootstrap code included in a plurality of other bootstrap codes in the FPGA, the first bootstrap code configured to dimension the next set of data, the plurality of other bootstrap codes including a second bootstrap code configured to extract the next set of data from a data source, a third bootstrap code configured to process the next set of data extracted by the second bootstrap code, a fourth bootstrap code configured to determine an order in which the next set of data is processed by the third bootstrap code, and a fifth bootstrap code configured to determine a configuration of the next set of data; and based on the received change and the updated at least one bootstrap code, the computer extracting and subsequently processing the next set of data.

2. The method of claim 1, further comprising the steps of:
the computer determining at least one new rule based on the updated at least one bootstrap code;
the computer storing the at least one new rule in a data warehouse; and
based on the at least one new rule, the computer determining the configuration, the configuration including a filter for extracting the next set of data, wherein the step of extracting the next set of data is based on the filter, and wherein the step of processing the next set of data is based on the at least one new rule and the configuration.

3. The method of claim 2, further comprising the step of based on the updated at least one bootstrap code, the computer generating a model for the next set of data, wherein the step of determining the configuration includes determining the configuration as including a mapping of the next set of data to the model, and wherein the step of processing the next set of data is further based on the mapping.

4. The method of claim 1, further comprising the steps of:
the computer executing the updated at least one bootstrap code; and
in response to the step of executing the updated at least one bootstrap code, the computer determining the configuration of the next set of data, wherein the step of processing the next set of data is based on the configuration.

5. The method of claim 1, further comprising the steps of:
prior to the step of extracting the first set of data and based on the at least one bootstrap code, the computer allocating resources of the FPGA; and
subsequent to the step of processing the next set of data and based on the updated at least one bootstrap code, the computer reallocating the resources of the FPGA.

6. The method of claim 5, further comprising the steps of:
the computer determining a first scenario of a business, wherein the step of allocating the resources is based on the first scenario; and
the computer determining a second scenario of the business, the second scenario being different from the first scenario, wherein the step of reallocating the resources is based on the second scenario.

7. The method of claim 5, wherein the step of reallocating the resources of the FPGA includes reallocating memory space of the FPGA.

8. The method of claim 1, further comprising the step of:
providing at least one support service for at least one of creating, integrating, hosting, maintaining, and deploying computer-readable program code in the computer, the program code being executed by a processor of the computer to implement the steps of extracting and processing the first set of data, receiving the change, executing the first bootstrap code, updating the at least one bootstrap code, and extracting and subsequently processing the next set of data.

9. A computer system comprising:
a central processing unit (CPU);
a memory coupled to the CPU;
a computer-readable, tangible storage device coupled to the CPU, the storage device containing instructions that are executed by the CPU via the memory to implement a method of managing resources of a field-programmable gate array (FPGA), the method comprising:
the computer system at a runtime extracting and processing a first set of data;
via a very high speed integrated circuit hardware description language (VHDL) interface, the computer system at the runtime receiving a change in a size of a next set of data to be processed, a structure of the next set of data to be processed, or a load schedule of the next set of data to be processed, the change determined by a quantitative method analyzing the first set of data, the quantitative method executing external to the FPGA;
based on the received change, the computer system at the runtime executing a first bootstrap code in the FPGA;
in response to the step of executing the first bootstrap code and based on the received change, the computer system at the runtime updating at least one bootstrap code included in a plurality of other bootstrap codes in the FPGA, the first bootstrap code configured to dimension the next set of data, the plurality of other bootstrap codes including a second bootstrap code configured to extract the next set of data from a data source, a third bootstrap code configured to process the next set of data extracted by the second bootstrap code, a fourth bootstrap code configured to determine an order in which the next set of data is processed by the third bootstrap code, and a fifth bootstrap code configured to determine a configuration of the next set of data; and
based on the received change and the updated at least one bootstrap code, the computer system extracting and subsequently processing the next set of data.

10. The computer system of claim 9, wherein the method further comprises the steps of:
the computer system determining at least one new rule based on the updated at least one bootstrap code;
the computer system storing the at least one new rule in a data warehouse; and
based on the at least one new rule, the computer system determining the configuration, the configuration including a filter for extracting the next set of data, wherein the step of extracting the next set of data is based on the filter, and wherein the step of processing the next set of data is based on the at least one new rule and the configuration.

11. The computer system of claim 10, wherein the method further comprises the step of based on the updated at least one bootstrap code, the computer system generating a model for the next set of data, wherein the step of determining the configuration includes determining the configuration as including a mapping of the next set of data to the model, and wherein the step of processing the next set of data is further based on the mapping.

12. The computer system of claim 9, wherein the method further comprises the steps of:
the computer system executing the updated at least one bootstrap code; and
in response to the step of executing the updated at least one bootstrap code, the computer system determining the configuration of the next set of data, wherein the step of processing the next set of data is based on the configuration.

13. The computer system of claim 9, wherein the method further comprises the steps of:
prior to the step of extracting the first set of data and based on the at least one bootstrap code, the computer system allocating resources of the FPGA; and
subsequent to the step of processing the next set of data and based on the updated at least one bootstrap code, the computer system reallocating the resources of the FPGA.

14. The computer system of claim 13, wherein the method further comprises the steps of:
the computer system determining a first scenario of a business, wherein the step of allocating the resources is based on the first scenario; and
the computer system determining a second scenario of the business, the second scenario being different from the first scenario, wherein the step of reallocating the resources is based on the second scenario.

15. A computer program product, comprising:
a computer-readable, tangible storage device; and
a computer-readable program code stored in the computer-readable, tangible storage device, the computer-readable program code containing instructions that are executed by a central processing unit (CPU) of a computer system to implement a method of managing resources of a field-programmable gate array (FPGA), the method comprising:
the computer system at a runtime extracting and processing a first set of data;
via a very high speed integrated circuit hardware description language (VHDL) interface, the computer system at the runtime receiving a change in a size of a next set of data to be processed, a structure of the next set of data to be processed, or a load schedule of the next set of data to be processed, the change determined by a quantitative method analyzing the first set of data, the quantitative method executing external to the FPGA;
based on the received change, the computer system at the runtime executing a first bootstrap code in the FPGA;
in response to the step of executing the first bootstrap code and based on the received change, the computer system at the runtime updating at least one bootstrap code included in a plurality of other bootstrap codes in the FPGA, the first bootstrap code configured to dimension the next set of data, the plurality of other bootstrap codes including a second bootstrap code configured to extract the next set of data from a data source, a third bootstrap code configured to process the next set of data extracted by the second bootstrap code, a fourth bootstrap code configured to determine an order in which the next set of data is processed by the third bootstrap code, and a fifth bootstrap code configured to determine a configuration of the next set of data; and
based on the received change and the updated at least one bootstrap code, the computer system extracting and subsequently processing the next set of data.

16. The program product of claim 15, wherein the method further comprises the steps of:
the computer system determining at least one new rule based on the updated at least one bootstrap code;
the computer system storing the at least one new rule in a data warehouse; and
based on the at least one new rule, the computer system determining the configuration, the configuration including a filter for extracting the next set of data, wherein the step of extracting the next set of data is based on the filter, and wherein the step of processing the next set of data is based on the at least one new rule and the configuration.

17. The program product of claim 16, wherein the method further comprises the step of based on the updated at least one bootstrap code, the computer system generating a model for the next set of data, wherein the step of determining the configuration includes determining the configuration as including a mapping of the next set of data to the model, and wherein the step of processing the next set of data is further based on the mapping.

18. The program product of claim 15, wherein the method further comprises the steps of:
the computer system executing the updated at least one bootstrap code; and
in response to the step of executing the updated at least one bootstrap code, the computer system determining the configuration of the next set of data, wherein the step of processing the next set of data is based on the configuration.

19. The program product of claim 18, wherein the method further comprises the steps of:
prior to the step of extracting the first set of data and based on the at least one bootstrap code, the computer system allocating resources of the FPGA; and
subsequent to the step of processing the next set of data and based on the updated at least one bootstrap code, the computer system reallocating the resources of the FPGA.

20. The program product of claim 19, wherein the method further comprises the steps of:
the computer system determining a first scenario of a business, wherein the step of allocating the resources is based on the first scenario; and
the computer system determining a second scenario of the business, the second scenario being different from the first scenario, wherein the step of reallocating the resources is based on the second scenario.

* * * * *